United States Patent
Thanu et al.

(10) Patent No.: US 12,226,896 B2
(45) Date of Patent: Feb. 18, 2025

(54) OPERATIONS OF ROBOT APPARATUSES WITHIN RECTANGULAR MAINFRAMES

(71) Applicant: Applied Materials, Inc., Santa Clara, CA (US)

(72) Inventors: Rajkumar Thanu, Santa Clara, CA (US); Jeffrey C. Hudgens, San Francisco, CA (US); Damon K. Cox, Jarrell, TX (US); Matvey Farber, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 149 days.

(21) Appl. No.: 17/968,870

(22) Filed: Oct. 19, 2022

(65) Prior Publication Data
US 2023/0132174 A1    Apr. 27, 2023

Related U.S. Application Data

(60) Provisional application No. 63/270,725, filed on Oct. 22, 2021.

(51) Int. Cl.
| | |
|---|---|
| B25J 9/04 | (2006.01) |
| B25J 11/00 | (2006.01) |
| B25J 21/00 | (2006.01) |
| H01L 21/67 | (2006.01) |

(52) U.S. Cl.
CPC .............. B25J 21/00 (2013.01); B25J 9/043 (2013.01); B25J 11/0095 (2013.01); H01L 21/67196 (2013.01)

(58) Field of Classification Search
None
See application file for complete search history.

(56) References Cited

U.S. PATENT DOCUMENTS

| | | |
|---|---|---|
| 8,317,449 B2 | 11/2012 | Newman et al. |
| 10,029,363 B2 | 7/2018 | Kremerman |
| 10,424,498 B2 | 9/2019 | Hofmeister |
| 10,950,484 B2 * | 3/2021 | Hosek ............... H01L 21/67742 |
| 11,358,809 B1 | 6/2022 | Thanu et al. |
| 2012/0232690 A1 | 9/2012 | Gilchrist et al. |
| 2015/0098790 A1 | 4/2015 | Wakabayashi |

(Continued)

FOREIGN PATENT DOCUMENTS

JP    2004288719 A    10/2004

OTHER PUBLICATIONS

International Search Report and Written Opinion for International Application No. PCT/US2023/031144, mailed Jan. 5, 2024, 11 pages.

*Primary Examiner* — Michael S Lowe
(74) *Attorney, Agent, or Firm* — Lowenstein Sandler LLP

(57) ABSTRACT

A robot apparatus is configured to extend a first end effector into a first process chamber and extend a second end effector into a second process chamber. The first process chamber and the second process chamber are separated by a first pitch. The robot apparatus is further configured to retract the first end effector and the second end effector into a rectangular mainframe while maintaining a distance between the substrates bounded by the first pitch throughout a retraction process, and fold the first end effector and the second end effector inward within a sweep diameter defined by a width of the rectangular mainframe.

20 Claims, 9 Drawing Sheets

(56) References Cited

U.S. PATENT DOCUMENTS

| | | |
|---|---|---|
| 2018/0001478 A1 | 1/2018 | Freeman et al. |
| 2020/0384634 A1 | 12/2020 | Muthukamatchy et al. |
| 2020/0384636 A1 | 12/2020 | Muthukamatchy et al. |
| 2021/0146554 A1 | 5/2021 | Hudgens et al. |

* cited by examiner

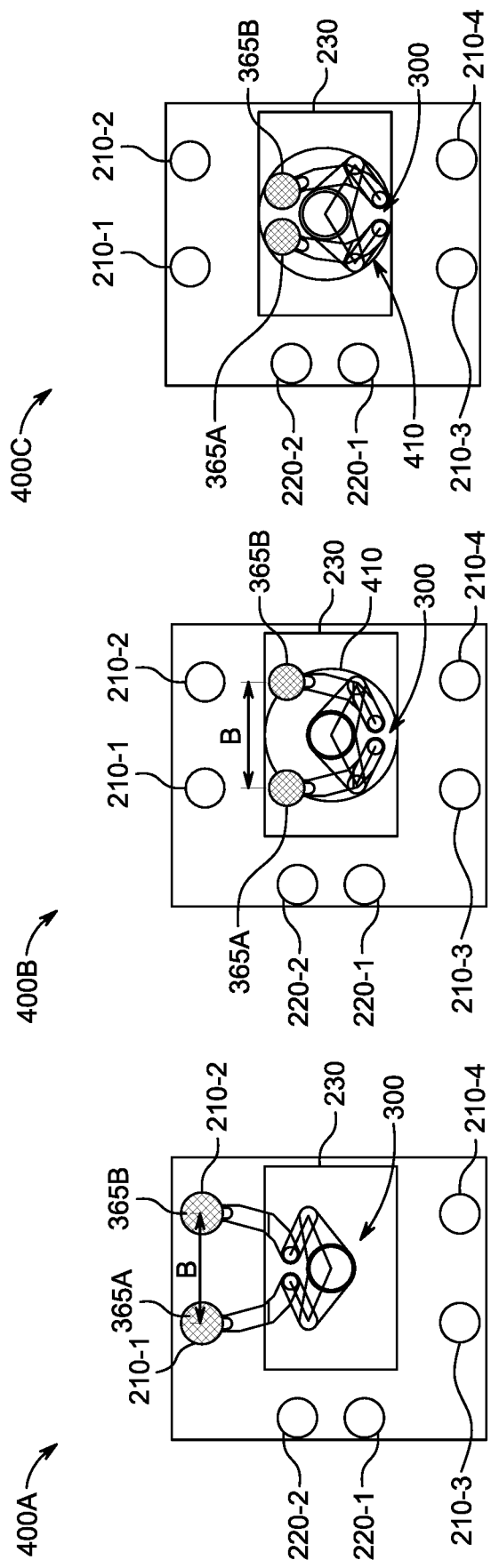

OPERATIONS OF ROBOT APPARATUSES WITHIN RECTANGULAR MAINFRAMES

RELATED APPLICATION

This application claims the benefit of U.S. Provisional Patent Application No. 63/270,725, filed on Oct. 22, 2021 and entitled "OPERATIONS OF ROBOT APPARATUSES WITHIN RECTANGULAR MAINFRAMES", the entire contents of which are incorporated by reference herein.

FIELD

Embodiments of the present application relate to robots including multiple end effectors and electronic device processing devices and methods including robots with multiple end effectors.

BACKGROUND

Processing of substrates in semiconductor electronic device manufacturing may include a combination of different processes applied in the same substrate processing system. For example, the processes may include chemical vapor deposition/atomic layer deposition (CVD/ALD) and physical vapor deposition (PVD) applied within the same tool or platform. These processes may be applied using different configurations of processing chambers coupled to a mainframe. Robots are located in a transfer chamber of the mainframe and are configured to move substrates between the various processing chambers.

SUMMARY

In some embodiments, a robot apparatus is provided. The robot apparatus includes a lower shoulder and an upper shoulder each configured to rotate about a first rotational axis, a first arm rotatably coupled to the lower shoulder at a second rotational axis, a second arm rotatably coupled to the upper shoulder at a third rotational axis, and a first forearm rotatably coupled to the first arm at a fourth rotational axis and a second forearm rotatably coupled to the second arm at a fifth rotational axis. The first forearm and the second forearm each have a different length from the lower arm and the upper arm. The robot apparatus further includes a first end effector coupled to the first forearm and a second end effector coupled to the second forearm. The robot apparatus is configured to extend the first end effector into a first process chamber and extend the second end effector into a second process chamber. The first process chamber and the second process chamber are separated by a first pitch. The robot apparatus is further configured to retract the first end effector and the second end effector into a rectangular mainframe while maintaining a distance between the first end effector and the second end effector bounded by the first pitch throughout a retraction process, and fold the first end effector and the second end effector inward within a sweep diameter defined by a width of the rectangular mainframe.

In some embodiments, an electronic device processing system is provided. The electronic device processing system includes a rectangular mainframe, a first load lock chamber and a second load lock chamber attached to a first side of the rectangular mainframe, wherein a first port of the first load lock chamber and a second port of the second load lock chamber are spaced apart horizontally by a first pitch, a first process chamber and a second process chamber attached to a second side of the rectangular mainframe, wherein a third port of the first process chamber and a fourth port of the second process chamber are spaced apart horizontally by a second pitch that is greater than the first pitch, and a robot apparatus housed within the rectangular mainframe. The robot apparatus includes a lower shoulder and an upper shoulder each configured to rotate about a first rotational axis, a first arm rotatably coupled to the lower shoulder at a second rotational axis, a second arm rotatably coupled to the upper shoulder at a third rotational axis, and a first forearm rotatably coupled to the first arm at a fourth rotational axis and a second forearm rotatably coupled to the second arm at a fifth rotational axis. The first forearm and the second forearm each have a different length from the lower arm and the upper arm. The robot apparatus further includes a first end effector coupled to the first forearm and a second end effector coupled to the second forearm. The robot apparatus is configured to extend the first end effector into the first process chamber and extend the second end effector into the second process chamber, retract the first end effector and the second end effector into the rectangular mainframe while maintaining a distance between the first end effector and the second end effector bounded by the second pitch throughout retraction, and fold the first end effector and the second end effector inward within a sweep diameter defined by a width of the rectangular mainframe.

In some embodiments, a method is provided. The method includes, for a robot apparatus including a lower shoulder and an upper shoulder each configured to rotate about a first rotational axis, a first arm rotatably coupled to the lower shoulder at a second rotational axis, a second arm rotatably coupled to the upper shoulder at a third rotational axis, a first forearm rotatably coupled to the first arm at a fourth rotational axis and a second forearm rotatably coupled to the second arm at a fifth rotational axis, where the first forearm and the second forearm each have a different length from the lower arm and the upper arm, and a first end effector coupled to the first forearm and a second end effector coupled to the second forearm: extending, by the robot apparatus, the first end effector into a first process chamber to retrieve a first substrate, extending, by the robot apparatus, the second end effector into a second process chamber to retrieve a second substrate, wherein the first process chamber and the second process chamber are separated by a first pitch, retracting, by the robot apparatus, the first end effector and the second end effector into a rectangular mainframe while maintaining a distance between the substrates bounded by the first pitch throughout retraction, and folding, by the robot apparatus, the first end effector and the second end effector inward within a sweep diameter defined by a width of the rectangular mainframe.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes only and are not necessarily drawn to scale. The drawings are not intended to limit the scope of the disclosure in any way. Wherever possible, the same or like reference numbers will be used throughout the drawings to refer to the same or like parts.

FIGS. 4A-4C illustrate top-down views of the operation of a robot apparatus housed within a rectangular mainframe according to some embodiments.

DETAILED DESCRIPTION

Figure 1:
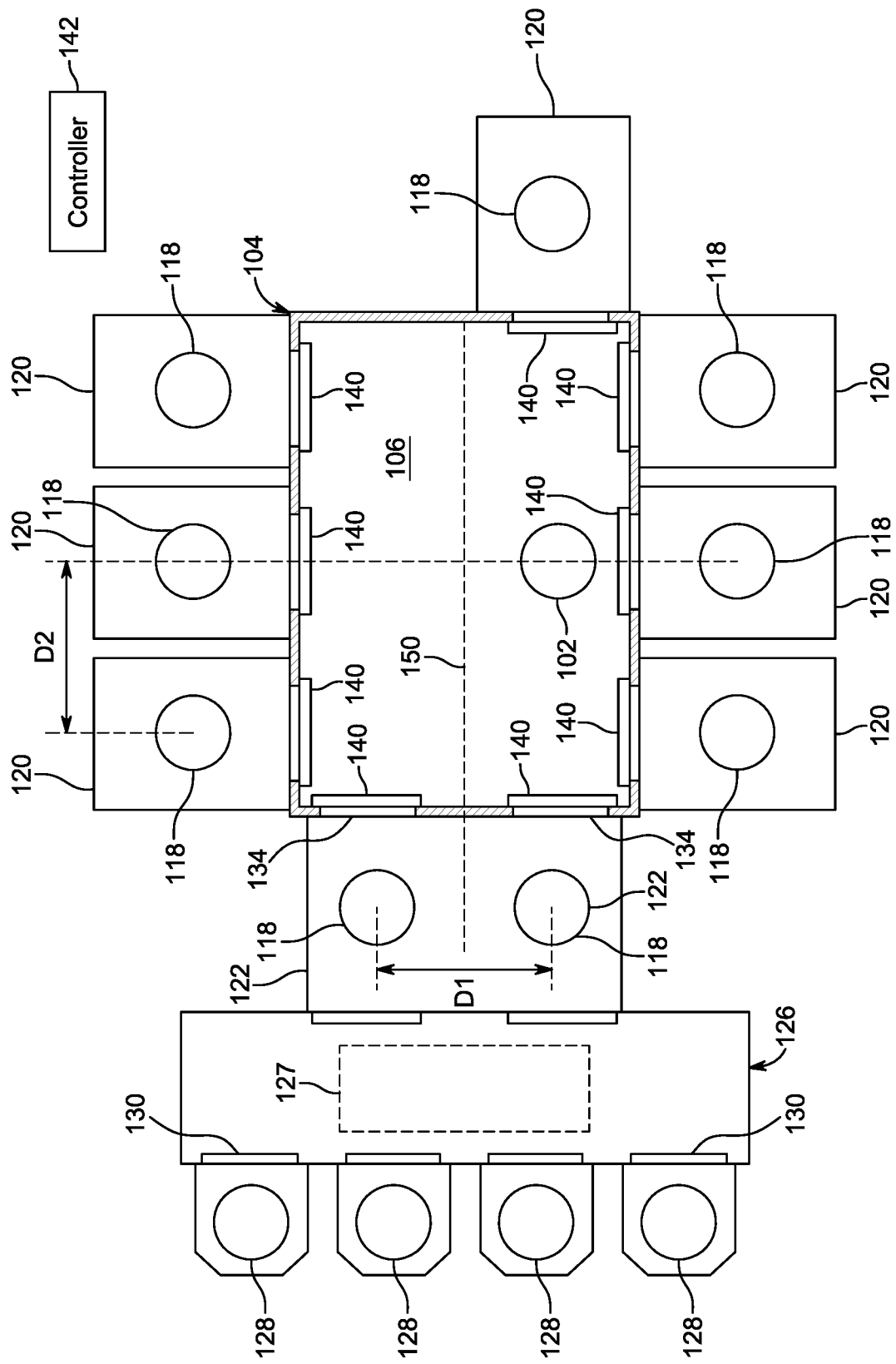
FIG. 1 illustrates a schematic top view of a substrate processing system including a robot apparatus housed within a mainframe according to the disclosed embodiments.

Reference will now be made in detail to the example embodiments provided, which are illustrated in the accompanying drawings. Features of the various embodiments described herein may be combined with each other unless specifically noted otherwise.

Electronic device processing systems may implement a combination of multiple substrate manufacturing processes. These substrate manufacturing processes may include chemical vapor deposition/atomic layer deposition (CVD/ALD) processes, annealing processes, etch processes, physical vapor deposition (PVD) and/or other processes. The electronic device processing systems may include a variety of different process chambers and load lock chambers to implement the combination of multiple substrate manufacturing processes. These process chambers and load lock chambers may each include one or more processing locations on which substrates are positioned for processing. Processing locations in different process chambers and/or load lock chambers may be separated by different distances (e.g., pitches) depending on a physical arrangement or process chambers, the type of manufacturing process to be implemented within each process chamber and/or the configuration of the process chambers. Pitch may refer to a spacing between ports of adjacent chambers (e.g., between two load lock chambers spaced apart horizontally or between two process chambers spaced apart horizontally) in embodiments.

A robot apparatus can be housed within a mainframe that includes a transfer chamber. In some embodiments, multiple load lock chambers and/or multiple process chambers are connected to sides or facets of the transfer chamber. The robot apparatus can be a dual end effector robot apparatus having a pair of end effectors for transferring substrates between load lock chambers and/or transfer chambers. The robot apparatus may by designed such that a pitch or separation between the dual end effectors is adjustable, and may be further designed such that the end effectors may be positioned both for single substrate handling (in which a single substrate is removed from and/or inserted into a process chamber or load lock) and may further be positioned for dual substrate handling (in which two substrates are removed from and/or inserted into a process chamber or load lock).

A robot apparatus can be adapted and configured to place substrates within and/or remove substrates from, a pair of process chambers (e.g., side-by-side process chambers) and/or load lock chambers simultaneously. However, existing robot apparatuses may not be able to maintain a constant pitch with respect to both an extended position of the dual end effectors and a retracted position of the dual end effectors. Additionally, the pitch at the retracted position of the dual end effectors may cause the operation of the robot apparatus to exceed sweep diameter specifications with respect to geometric constraints of a mainframe that houses the robot apparatus within the transfer chamber. A sweep diameter refers to the diameter of the circle during the rotational motion of the links of the robot apparatus in a retracted posture. This is particularly true with respect to a robot apparatus housed within a rectangular mainframe in which a length of the mainframe is greater than a width of the rectangular mainframe, as the sweep diameter may be constrained by the width of the rectangular mainframe. The process chambers can be positioned along one or more sides (e.g., the lengths) of the rectangular mainframe, while the load lock chambers can be positioned along one or more sides (e.g., the widths) of the rectangular mainframe. In some embodiments, a pitch between pairs of process chambers may be different than a pitch between pairs of load lock chambers.

To address at least the above noted drawbacks, the robot apparatuses described herein can operate within a rectangular mainframe in a single substrate processing mode, a dual substrate processing mode, or a combination thereof. This added flexibility and independent access capability permits sequential loading and unloading of various processing chambers and/or load lock chambers. This capability also allows the robot apparatus to continue operating even when one processing chamber or load lock chamber out of a pair of adjacent processing chambers or load lock chambers is inoperative.

With respect to process chambers, while operating in a dual substrate processing mode, a robot apparatus housed within a rectangular mainframe can simultaneously extend a pair of end effectors into respective process chambers to obtain (or drop off) respective substrates or wafers, simultaneously retract the pair of end effectors inside the rectangular mainframe, and fold the arms at the end of the retraction to allow rotation within a particular width of the rectangular mainframe. With respect to load lock chambers, while operating in a dual substrate processing mode, a robot apparatus housed within a rectangular mainframe can independently extend a pair of end effectors into respective load lock chambers to obtain respective substrates or wafers, and independently retract the pair of end effectors into the rectangular mainframe. As another example, while operating in a dual substrate processing mode, a robot apparatus housed within a rectangular mainframe can perform coordinated extension of a pair of end effectors into respective load lock chambers to obtain respective substrates or wafers, and coordination retraction of the pair of end effectors into the rectangular mainframe, in which a first end effector of the pair lags behind a second effector of the pair. Further details regarding the robot apparatus will now be described in further detail.

FIG. 1 illustrates a schematic top view of a substrate processing system 100 including a robot apparatus 102 according to disclosed embodiments. The substrate processing system 100 may include a mainframe 104 including a transfer chamber 106 formed by walls thereof. Though the mainframe 104 is illustrated to be a square mainframe, the mainframe 104 may alternatively have other shapes. For example, the mainframe 104 may have a rectangular shape, in which a first pair of parallel sides has a first length and a second pair of parallel sides has a different second length. In another example, the mainframe may have more or fewer sides than four, such as five sides, six sides, seven sides, and so on. In such embodiments, different sides may have the same or different sizes (e.g., lengths or widths). The transfer chamber 106 may be configured to operate in a vacuum, for example. The transfer chamber may have a center 150. The robot apparatus 102 may be at least partially located in the transfer chamber 106 and may be configured to be operable therein. The robot apparatus 102 may include a body (e.g., 314 in FIG. 3A) that is configured to be attached to a wall (e.g., the floor) of the transfer chamber 106. The robot apparatus 102 may be "off axis" or "off center," which as used herein, refers to the robot apparatus having at least one lower arm configured to rotate about a first rotational axis that is offset from the center 150 of the transfer chamber 106.

The robot apparatus 102 may be configured to pick and/or place substrates 118 (sometimes referred to as a "wafers" or "semiconductor wafers") to and from different destinations. The destinations may be process chambers coupled to the transfer chamber 106. The destinations may also be load lock chambers coupled to transfer chamber 106. For example, the destinations may be one or more process chambers 120 and one or more load lock chambers 122 that may be coupled to transfer chamber 106. The mainframe 104 may include more or fewer process chambers 120 than illustrated in FIG. 1 and more or fewer load lock apparatus 122 than illustrated in FIG. 1.

The process chambers 120 may be configured to carry out any number of process steps on the substrates 118, such as deposition, oxidation, nitration, etching, polishing, cleaning, lithography, or the like. In FIG. 1, seven process chambers 120 are shown coupled to various sides of transfer chamber 106. However, it should be noted that other configurations that include more or fewer process chambers are also feasible and contemplated by the instant disclosure. In certain embodiments, the number of process chambers coupled to the transfer chamber 106 ranges from 4 to 24. In certain embodiments, the number of process chambers coupled to the transfer chamber 106 ranges from 4 to 20. In certain embodiments, the number of process chambers coupled to the transfer chamber 106 ranges from 5 to 16. In certain embodiments, the number of process chambers coupled to the transfer chamber 106 ranges from 6 to 10. In some embodiments, the transfer chamber 106 is a linear transfer chamber having two longer sides and two shorter sides. For example, the transfer chamber 106 can be included within a rectangular mainframe 104. In other embodiments, the transfer chamber may have more than four sides, such as five sides, six sides, seven sides, eight sides, and so on. The multiple sides may have a same size (e.g., a same length) and/or different sizes.

The load lock chambers 122 may be configured to interface with a factory interface 126. The factory interface 126 may include a load/unload robot 127 (shown as a dotted box) configured to transport substrates 118 to and from substrate carriers 128 (e.g., Front Opening Unified Pods (FOUPs)) docked at load ports 130 of the factory interface 126. Another load/unload robot may transfer the substrates 118 between the substrate carriers 128 and the load lock chambers 122 in any sequence or order.

One or more of the load lock chambers 122 may be accessed by the robot apparatus 102 through slit valves 134. One or more of the process chambers 120 may be accessed by the robot apparatus 102 through slit valves 140.

The robot apparatus 102 can include a lower shoulder and an upper shoulder each configured to rotate about a first rotational axis, a first arm rotatably coupled to the lower shoulder at a second rotational axis, a second arm rotatably coupled to the upper shoulder at a third rotational axis, and a first forearm rotatably coupled to the first arm at a fourth rotational axis and a second forearm rotatably coupled to the second arm at a fifth rotational axis. The first forearm and the second forearm each have a different length from the lower arm and the upper arm. The robot apparatus 102 can further include a first end effector coupled to the first forearm and a second end effector coupled to the second forearm. In some embodiments, the first end effector and the second end effector of robot apparatus 102 are co-planar. Further details regarding the robot apparatus 102 are described below with reference to FIGS. 2A-5.

The slit valves 134 and 140 may have a slit valve width that allows the robot apparatus 102, and particularly, the first end effector and the second end effector, to access them in both, dual substrate handling mode and in single substrate handling mode. In certain embodiments, the first end effector and/or the second end effector access the slit valve(s) 134 and/or slit valve(s) 140 orthogonally (relative to the horizontal opening of slit valve 134 or of slit valve 140). In alternative embodiments, the first end effector and/or the second end effector access the slit valve(s) 134 and/or the slit valve(s) 140 at an angle (relative to the horizontal center line of slit valve 134 or of slit valve 140). The first and/or the second end effector(s) may access one or more of slit valve(s) 134 and/or 140 at an angle ranging from about 0° to about 20°, from about 5° C. to about 17°, or from about 7° to about 14° relative, when measured relative to the horizontal center line of slit valve 134 or of slit valve 140.

"Dual substrate handling mode," as used herein refers to the robot apparatus 102 concurrently accessing two adjacent chambers (e.g., process chambers 120 or load lock chambers 122) using the first and second end effectors. In some embodiments, dual substrate handling mode includes simultaneously extending the first and second end effectors into respective first and second chambers. In some embodiments, dual substrate handling mode includes performing coordinated extension of the first and second end effectors into the respective first and second chambers, where the first end effector extends into the first chamber at a first time and the second end effector extends into the second chamber at a second time after the first time and prior to full retraction of the first end effector (e.g., lagged extension). In some embodiments, dual substrate handling mode includes independently extending the first and second end effectors into the respective first and second chambers (e.g., the first end effector extends into, and retracts from, the first chamber, and the second end effector extends into the second chamber after the first end effector has completed retraction).

"Single substrate handling mode," as used herein refers to the robot apparatus accessing one chamber (e.g., process chamber 120 or load lock chamber 122) using one of the first or second end effectors. The end effector that is not being used to pick or place a substrate may be rotated out of the way so that it does not interfere with picking or placing of the substrate by the other end effector that is performing picking and placing of a substrate.

The term "access," as used herein with reference to the one or more of the end effectors accessing one or more load lock chamber(s) and/or process chamber(s) refers to the end effector(s) accessing said chamber to pick up substrate(s), drop off substrate(s), exchange substrate(s), and/or any other operation those skilled in the art would understand to be performed by end effectors accessing a load lock chamber(s) and/or a process chamber(s).

Various embodiments of robot apparatus 102 are contemplated herein, as will be illustrated in further detail with respect to FIGS. 2A-5. The mode of operation for dual substrate handling mode and single substrate handling mode may vary for different embodiments of robot apparatus 102, as will be illustrated in further detail with respect to FIGS. 2A-4D.

A controller 142 may be in communication with the robot apparatus 102. The robot apparatus 102 may be controlled by suitable commands from the controller 142. The controller 142 may also control the slit valves 134 and 140 and other components and processes taking place within the mainframe 104, load lock chambers 122, and processing chambers 120.

Figure 2:
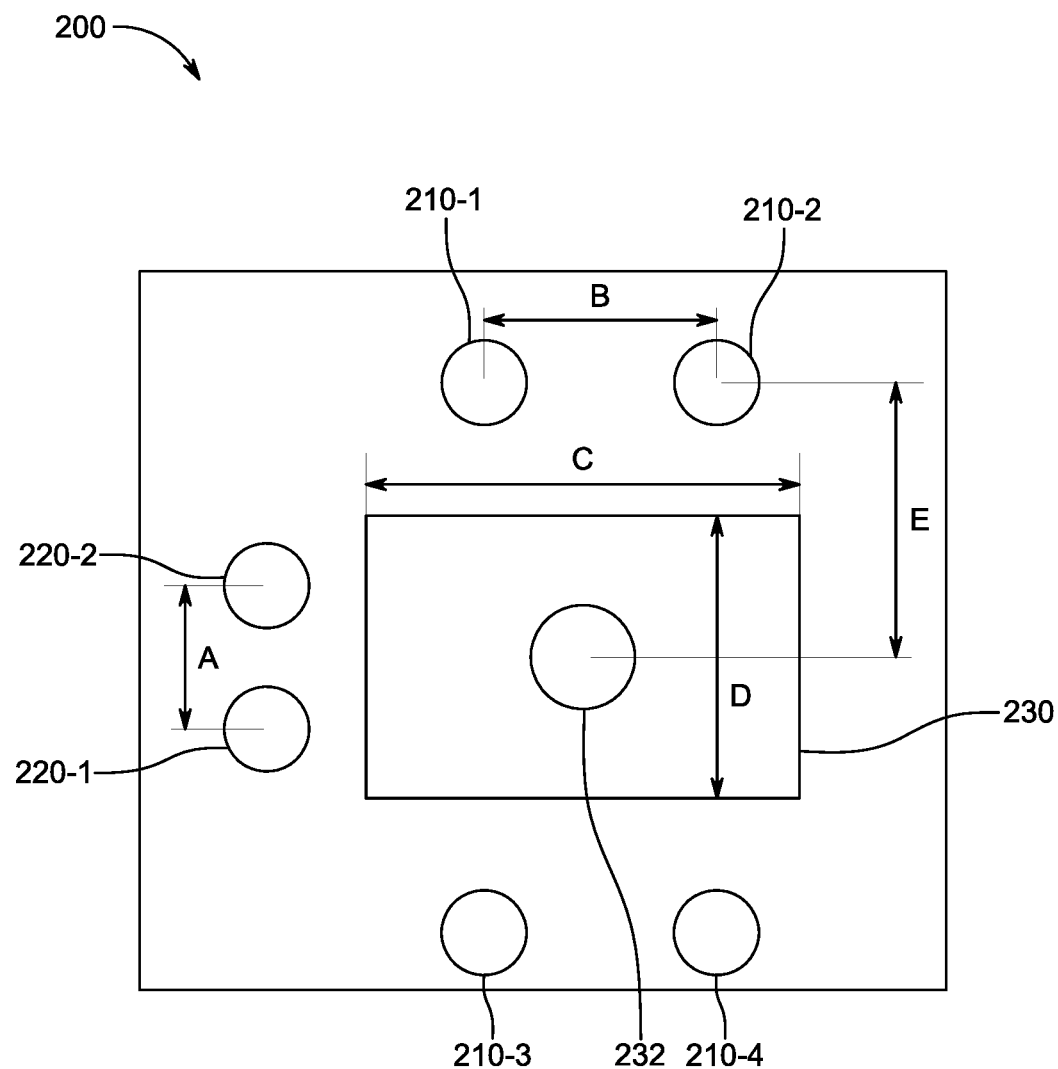
FIG. 2 illustrates a top-down view of a substrate processing system including a robot apparatus housed within a rectangular mainframe according to some embodiments.

FIG. 2 illustrates a top-down view of a substrate processing system ("system") 200 according to some embodiments. As shown, the system 200 includes a number of process chambers including adjacent process chambers 210-1 and 210-2, and adjacent process chambers 210-3 and 210-4, and a number of load lock chambers including adjacent load lock chambers 220-1 and 220-2. As further shown, the system 200 includes a rectangular mainframe 230 having a robot apparatus 232 housed therein (e.g., similar to the robot apparatus 102 housed within the mainframe 104 of FIG. 1).

As shown, the load lock chambers 220-1 and 220-2 are spaced apart by a first pitch "A" as measured between the centers of the load lock chambers 220-1 and 220-2 and/or between the centers of ports of the load lock chambers. As compared to square mainframes, the first pitch A between the centers of the load lock chambers 220-1 and 220-2 can be smaller as a result of the dimensions of the rectangular mainframe 230. In some embodiments, the first pitch A is in a range of about 20 inches to about 25 inches. In some embodiments, the first pitch A is in a range of about 21 inches to about 23 inches. In some embodiments, the first pitch A is about 22 inches. Other distances for the first pitch A may also be possible.

As further shown, at least the process chambers 210-1 and 210-2 are spaced apart by a second pitch "B" as measured between the centers of the process chambers 210-1 and 210-2. The second pitch B can be different from the first pitch A. For example, the second pitch B can be greater than first pitch A). As compared to square mainframes, the second pitch B between the centers of the process chambers 210-1 and 210-2 can be smaller as a result of the dimensions of the rectangular mainframe 230. In some embodiments, the second pitch B is in a range of about 32 inches to about 40 inches. In some embodiments, the second pitch B is in a range of about 34 inches to about 38 inches. In some embodiments, the second pitch B is about 36 inches. Other distances for the second pitch B may also be possible.

As further shown, the rectangular mainframe 230 can have a length "C". In some embodiments, the length C is in a range of about 40 inches to about 80 inches. In some embodiments, the length C is in a range of about 50 inches to about 70 inches. In some embodiments, the length C is about 67 inches (e.g., about 1700 millimeters (mm)). Other distances for the length C may also be possible. The rectangular mainframe 230 can have a width "D" different from the length C. In some embodiments, the width D is in a range of about 20 inches to about 60 inches. In some embodiments, the width D is in a range of about 30 inches to about 50 inches. In some embodiments, the width D is about 43 inches (e.g., about 1100 mm). Other distances for the width D may also be possible.

As further shown, the robot apparatus 232 and the process chamber 210-2 can be separated by a distance "E" as measured between the centers of the robot apparatus 232 and the process chamber 210-2. In some embodiments, the distance E is in a range of about 20 inches to about 60 inches. In some embodiments, the distance E is in a range of about 30 inches to about 50 inches. In some embodiments, the distance E is about 42 inches.

With respect to at least the process chambers 210-1 and 210-2, the robot apparatus 232 can extend its end effectors (not shown in FIG. 2) into the process chambers 210-1 and 210-2, either in a dual substrate handling mode (e.g., simultaneously, coordinated extension and retraction, or independently) to retrieve respective substrates, or in a single substrate handling mode to retrieve a single substrate, and then retract the end effector(s) inside of the rectangular mainframe 230 to maintain the second pitch B. However, with respect to conventional robot apparatus designs, the retracted position of the robot apparatus 232 can exceed a sweep diameter defined by the width D of the rectangular mainframe 230 (e.g., about 1100 mm). Thus, conventional robot motion control mechanisms may not support dual substrate handling modes that can maintain a distance between the first end effector and the second end effector bounded by the second pitch B at both the extended and retracted positions (e.g., substantially or approximately equal to the second pitch B) in accordance with the sweep diameter defined by the width D.

As will be described below with reference to FIGS. 4A-4C, in order to maintain the distance between the first end effector and the second end effector bounded by the second pitch B (e.g., approximately or substantially equal to the second pitch B) at both the extended and retracted positions in accordance with the sweep diameter defined by the width D with respect to a dual substrate handling mode (and thus improve processing throughput), the robot apparatus 232 described herein can be provided with a motion control mechanism that can enable the end effectors to be folded inwards at the end of retraction to enable rotation within the sweep diameter defined by the width D of the rectangular mainframe 230. For example, if the width D is about 1100 mm, then the end effectors of the robot apparatus 232 can be folded inwards after retraction at about 312 mm or about 12 inches to achieve a sweep diameter of about 1100 mm. More specifically, the robot apparatus 232 can be controlled with a combination of motors and cam pulleys designed to enable the compression or folding operation after retraction. Once the robot apparatus 232 is in a fully retracted state with the end effectors folded inwards, the robot apparatus 232 can be rotated without the robot apparatus 232 and/or supported substrates colliding with a wall of the rectangular mainframe.

With respect to at least the load lock chambers 220-1 and 220-2, the robot apparatus 232 can extend its end effectors (not shown in FIG. 2) into the load lock chambers 220-1 and 220-2, either in a dual substrate handling mode or a single substrate handling mode, to retrieve respective substrates, and then retract the end effectors inside of the rectangular mainframe 230. However, with respect to conventional robot apparatus designs, there may not be sufficient clearance to retract the end effectors based on the width D of the rectangular mainframe 230, such that appendages of the robot apparatus 232 can collide with the walls of the rectangular mainframe 230. Thus, conventional robot motion control mechanisms may not be able to avoid collision with the walls of the rectangular mainframe 230.

As will be described below with reference to FIGS. 5A-5D, a number of different arrangements can be provided to ensure that the retraction of the end effectors of the robot apparatus 232, after extension into the load lock chambers 220-1 and 220-2, sufficiently clears the walls of the rectangular mainframe 230. For example, the load lock chambers 220-1 and 220-2 can be independently accessed by respective load locks. As another example, to increase throughput relative to the independent access example, coordinated extension of a first end effector and a second end effector can achieved such that the second end effector lags behind the first end effector. That is, the first end effector extends into the load lock chamber 220-1 at a first time, and the second end effector extends into the load lock chamber 220-2 at a second time after the first time and prior to full retraction of the first end effector. As another example, the load lock chambers 220-1 and 220-2 can be positioned within the system 200 to achieve suitable load lock chamber access with respect to the first pitch A. As another example, a 4-theta drive mechanism can be used to enable a compressed motion envelope during load lock chamber extension (e.g., 2-theta for each end effector). Further details regarding the robot apparatus 232 will now be described below with reference to FIG. 3.

Figure 3A:
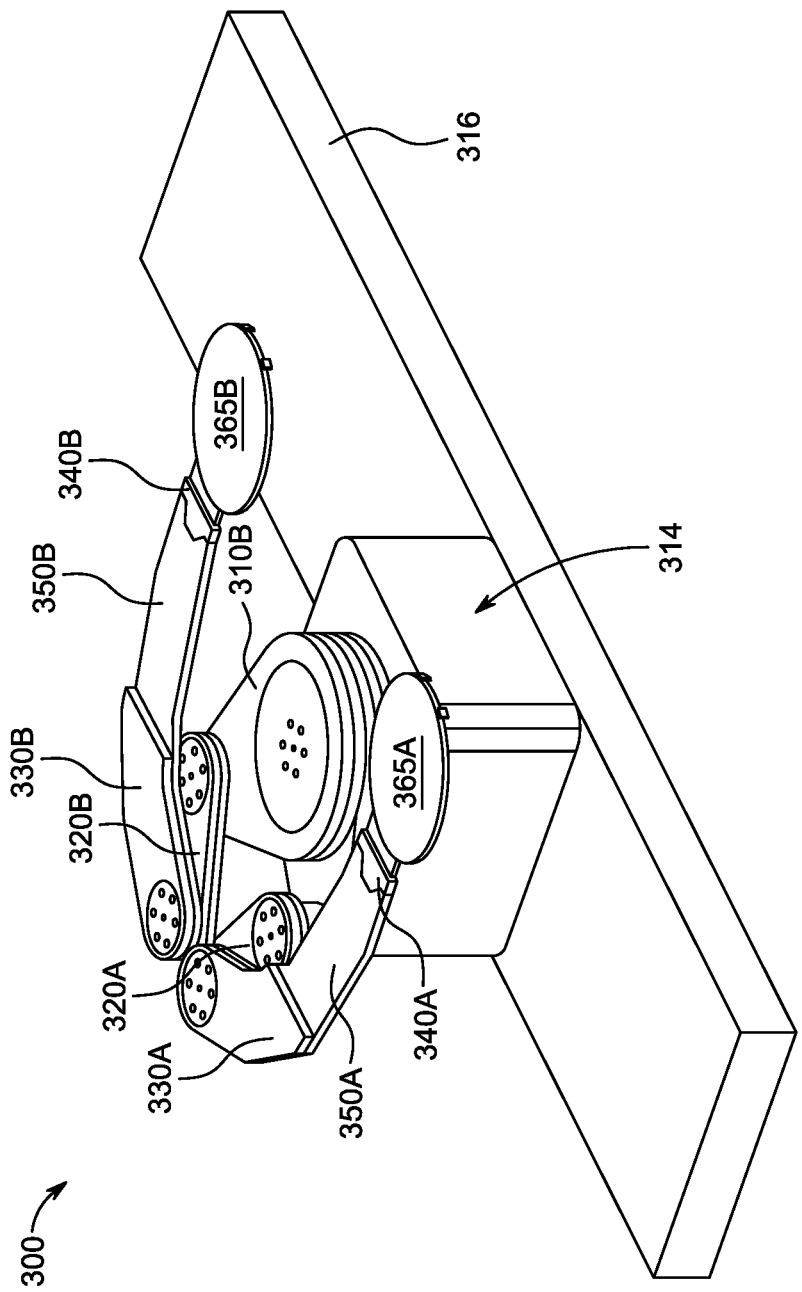
FIG. 3A illustrates a perspective view of a robot apparatus according to the disclosed embodiments.
Figure 3C:
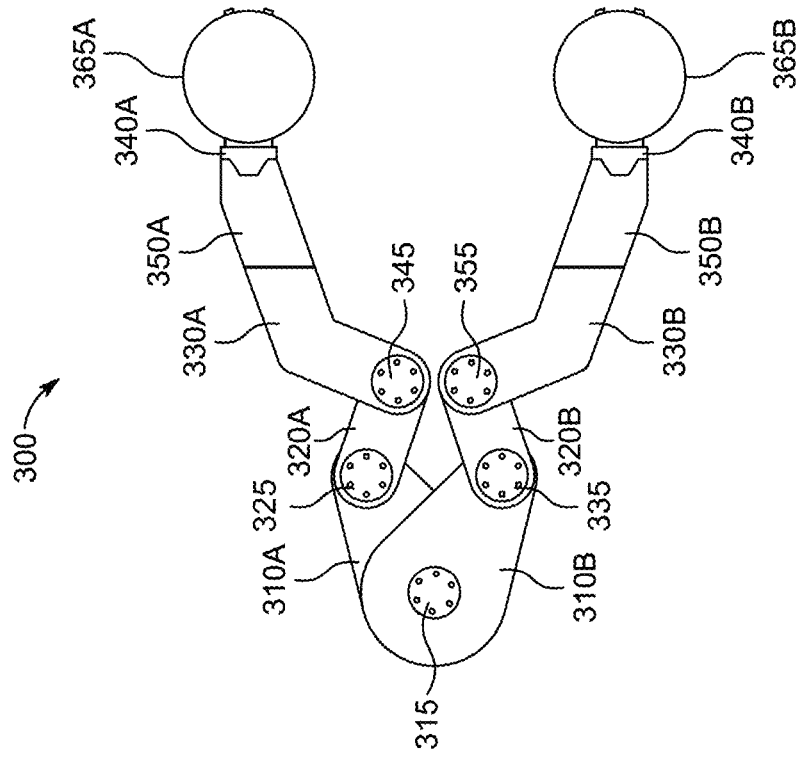
FIG. 3C illustrates a top-down view of the robot apparatus of FIG. 3A in an extended configuration (e.g., a twin chamber reach or a dual load lock reach in a dual substrate handling mode).
Figure 3B:
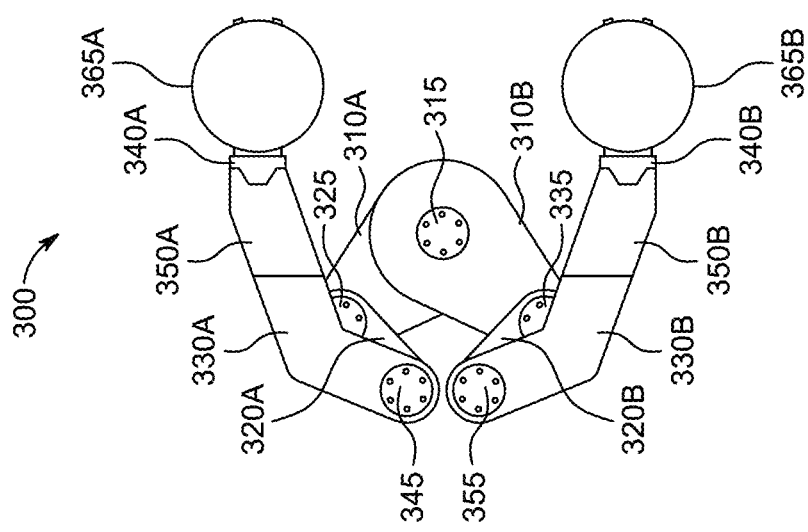
FIG. 3B illustrates a top-down view of the robot apparatus of FIG. 3A in a folded configuration (e.g., a chamber preposition or a load lock preposition).

FIGS. 3A-3C illustrate views of a robot apparatus 300 according to some embodiments. For example, the robot apparatus 300 can be the robot apparatus 102 of FIG. 1 and/or the robot apparatus 232 of FIG. 2. More specifically, FIG. 3A is a perspective view of the robot apparatus 300, FIG. 3B is a top-down view of the robot apparatus 300 in a contracted or folded configuration, and FIG. 3C is a top-down view of the robot apparatus 300 in an extended configuration. In some embodiments, the robot apparatus 300 is a SCARA (Selective Compliance Assembly or Articulated Robot Arm) robot apparatus including at least two SCARA arms.

The robot apparatus 300 may include a base or body 314 optionally mounted on a linear track 316. The base 314 may be configured to move along the linear track 316. In one embodiment, the linear track 316 is a maglev track, that may include one or more stators, and the base 314 includes a mover that can be magnetically moved by the stator(s) of the linear track 316. Robot apparatus 300 may further include a lower shoulder 310A and an upper shoulder 310B configured to rotate about a rotational axis 315. For example, one or more motors (not shown) located in the base 314 may independently rotate the lower shoulder 310A and/or the upper shoulder 310B about the rotational axis 315. As shown, the upper shoulder may be positioned above the lower shoulder.

The robot apparatus 300 may further include a first arm 320A rotatably coupled to the lower shoulder 310A at a rotational axis 325 that is spaced away from the first rotational axis 315. First arm 320A may be configured to rotate about the rotational axis 325. For example, one or more motors (not shown) located in the base 314 may rotate the first arm 320A about the rotational axis 325.

The robot apparatus 300 may further include a second arm 320B rotatably coupled to the upper shoulder 310B at a rotational axis 335 that is spaced away from the rotational axis 315. Second arm 320B may be configured to rotate about the rotational axis 335. For example, one or more motors (not shown) located in the base 314 may rotate the second arm 320B about the rotational axis 335.

The robot apparatus 300 may further include a first forearm 330A rotatably coupled to the first arm 320A at a rotational axis 345 spaced from the rotational axis 325. The first forearm 330A may include a first bend in a first direction within a horizontal plane. The first forearm 330A may be configured to independently rotate about the rotational axis 345. For example, one or more motors (not shown) located in the base 314 may independently rotate the first forearm 330A about the rotational axis 345 for both the dual substrate handling mode and the single substrate handling mode.

The robot apparatus 300 may further include a second forearm 330B rotatably coupled to the second arm 320B at a rotational axis 355 spaced from the rotational axis 335. The second forearm 330B may include a second bend in a second direction within a horizontal plane, wherein the second direction is opposite the first direction. The second forearm may be configured to independently rotate about the rotational axis 355. For example, one or more motors (not shown) located in the base 314 may independently rotate the second forearm 330B about the rotational axis 355 for both the dual substrate handling mode and the single substrate handling mode.

The robot apparatus 300 may further include a first end effector 340A that is coupled (optionally rotatably) to the first forearm 330A, optionally through a first wrist 350A. The robot apparatus 300 may also include a second end effector 340B that is coupled (optionally rotatably) to the second forearm 330B optionally through a second wrist 350B. In some embodiments, the first end effector 340A and the second end effector 340B are coplanar.

As shown in FIG. 3B, the lower shoulder 310A, the upper shoulder 310B, the first arm 320A, the second arm 320B, the first forearm 330A, the second forearm 330B, optionally the first wrist 350A, optionally the second wrist 350B, the first end effector 340A, and the second end effector 340B form together a "W" shape when the robot apparatus 300 is in a contracted (or folded) configuration as shown in FIG. 3B. In some embodiments and as will be described below with reference to FIGS. 4A-4C, on full retraction, the first and second forearms and first and second end effectors fold inward towards each other, reducing a pitch between the end effectors.

As shown in FIG. 3C, the lower shoulder 310A, the upper shoulder 310B, the first arm 320A, the second arm 320B, the first forearm 330A, the second forearm 330B, optionally the first wrist 350A, optionally the second wrist 350B, the first end effector 340A, and the second end effector 340B form together a "V" shape when the robot apparatus 300 is in an extended configuration, suitable for reaching into load lock chambers (e.g., load lock chambers 220-1 and 220-2) or into process chambers (e.g., process chambers 210-1 and 210-2) in a dual substrate operating mode.

The lower shoulder 310A, the upper shoulder 310B, the first arm 320A, the second arm 320B, the first forearm 330A, the second forearm 330B, optionally the first wrist 350A, optionally the second wrist 350B, the first end effector 340A, and the second end effector 340B are configured to independently rotate about their corresponding rotational axis (e.g., about the rotational axis 315, about the rotational axis 325, about the rotational axis 335, about the rotational axis 345, about the rotational axis 355, and/or about additional rotational axis (if any)) for both, the dual substrate handling mode and the single substrate handling mode.

During operation, robot apparatus 300 may move along the linear track 316 to access various process chambers and/or load lock chambers. In some embodiments, the robot apparatus 300 may have the retracted state as shown in FIG. 3B during movement along the linear track 316. In some embodiments, the robot 300 may have the retracted state described below with reference to FIG. 4C during movement along the linear track 316. Similarly, robot apparatus 300 may operate in single substrate handling mode, dual substrate handling mode, or a combination thereof to load and/or unload process chambers and/or load lock chambers.

Operating in the dual substrate handling mode can include independently rotating the lower shoulder 310A, the upper shoulder 310B, the first arm 320A, the second arm 320B, the first forearm 330A, the second forearm 330B, optionally the first wrist 350A, optionally the second wrist 350B, the first end effector 340A, and the second end effector 340B, about the rotational axis 315, the rotational axis 325, the rotational axis 335, the rotational axis 345, and the rotational axis 355 to space the first end effector 350A from the second effector 350B by the first pitch A or by the second pitch B.

Operating in the single substrate handling mode can include independently rotating the lower shoulder 310A, the upper shoulder 310B, the first arm 320A, the second arm 320B, the first forearm 330A, the second forearm 330B, optionally the first wrist 350A, optionally the second wrist 350B, the first end effector 340A, and the second end effector 340B, about the rotational axis 315, the rotational axis 325, the rotational axis 335, the rotational axis 345, and the eighth rotational axis 355 to align the first end effector 340A and the second end effector 340B in a configuration suitable for one of the first end effector 340A or the second end effector 340B to access one load lock chamber or one process chamber.

The first end effector 340A and the second end effector 340B can access adjacent chambers (e.g., process chambers or load lock chambers) to retrieve substrates 365A and 365B, respectively. The robot apparatus 300 can operate to retrieve the substrates 365A and/or 365B in a single and/or dual substrate handling mode from adjacent load lock chambers or adjacent process chambers. The substrates 365A and/or 365B can be transferred to different chambers (e.g., from the load lock chambers to adjacent process chambers or from the process chambers to adjacent load lock chambers).

One or more motors (not shown) located in the base 314 may independently rotate the lower shoulder 310A and the upper shoulder 310B about the rotational axis 315, the first arm 320A about the rotational axis 325, the second arm 320B about the rotational axis 335, the first forearm 330A about the rotational axis 345, and the second forearm 330B about the rotational axis 355 for both, the dual substrate handling mode and the single substrate handling mode.

For example, as shown, the forearms 320A and 320B and the arms 330A and 330B can have unequal lengths to enable variable pitch as a function of extension. A cam pulley design or a combination of a cam pulley design and one or more motors may be used to control one or more components of robot apparatus 300. For example, each of the forearms 320A and 320B may be driven independently by a respective motor. The arms 330A and 330B can each be coupled to a motor using at least one pulley (e.g., at least one non-circular pulley). The end effectors 340A and 340B can each be constrained by band drives including at least one pulley (e.g., at least one non-circular pulley) so that rotation of one of the forearms 320A and 320B can cause extension and retraction of the corresponding linkage along a straight line while the other linkage corresponding to the other one of the forearms 320A and 320B remains stationary. The use of non-circular pulleys can compensate for unequal link lengths (e.g., lower shoulder 310A does not have an equal length to forearm 320A, and upper shoulder 310B does not have an equal length to forearm 320B. Accordingly, the use of non-circular pulleys can enable the substrates 365A and 365B to move along respective linear radial paths with curved inward motion while maintaining the distance B during simultaneous extraction and retraction from adjacent process chambers 210-1 and 210-2.

The operation of the robot apparatus 300 within a rectangular mainframe (e.g., the rectangular mainframe 230 of FIG. 2) for retrieving substrates in a single and/or dual substrate handling mode with respect to adjacent process chambers will be further described below reference to FIGS. 4A-4C. The operation of the robot apparatus 300 within the rectangular mainframe for retrieving substrates in a single and/or dual substrate handling mode with respect to adjacent load lock chambers will be described below with reference to FIGS. 5A-5D.

FIGS. 4A-4C illustrate top-down views of a substrate processing system ("system") and operation of the robot apparatus 300 of FIG. 3 housed within the rectangular mainframe 230 of FIG. 2 according to some embodiments. More specifically, FIG. 4A illustrates an extension operation 400A to retrieve (or place) the substrates 365A and 365B from the process chambers 210-1 and 210-2 spaced apart by the pitch B, as described above with reference to FIGS. 2 and 3. FIG. 4B illustrates a retraction operation 400B to retract the substrates 365A and 365B (or empty end effectors) into the rectangular mainframe 230. As shown, the substrates 365A and 365B (or empty end effectors) are retracted into the rectangular mainframe 230 while maintaining an approximately or substantially constant distance B between the substrates 365A and 365B. In some embodiments, the distance B is not constant, but the distance between the centers of the substrates and/or end effectors is bounded by, or does not exceed, B. To ensure that the robot apparatus 300 and the substrates 365A and 365B are maintained within a sweep diameter 410 defined by the width of the rectangular mainframe 230 (e.g., width D described above with reference to FIG. 2), FIG. 4C illustrates a folding operation 400C in which the motion control mechanism of the robot apparatus 300 maneuvers the end effectors of the robot apparatus 300 (e.g., the first and second end effectors 340A and 340B of FIGS. 3A-3C) within the sweep diameter 410. The folding operation 400C can be achieved by utilizing the combination of motors and pulleys (e.g., non-circular pulleys), as described above with reference to FIGS. 3A-3C. Although not shown in FIGS. 4A-4C, robot apparatus 300 can also access a single load process chamber 210-1 or 210-2 to retrieve a single substrate 365A or 365B. This may be useful to continue operation of the electronic device processing system when, for example, one of the process chambers 210-1 or 210-2 is out of repair.

FIGS. 5A-5D illustrate top-down views of various substrate processing systems ("systems") including the robot apparatus 300 of FIG. 3 housed within the rectangular mainframe 230 of FIG. 2 according to some embodiments. As shown in FIGS. 5A-5D, the load lock chamber 220-1 and the rectangular mainframe 230 can be separated by a distance "I" as measured between the centers of the load lock chamber 220-1 and the rectangular mainframe 230. In some embodiments, the distance I is in a range of about 12 inches to about 20 inches. In some embodiments, the distance I is in a range of about 14 inches to about 18 inches. In some embodiments, the distance I is about 16 inches.

Figure 5B:
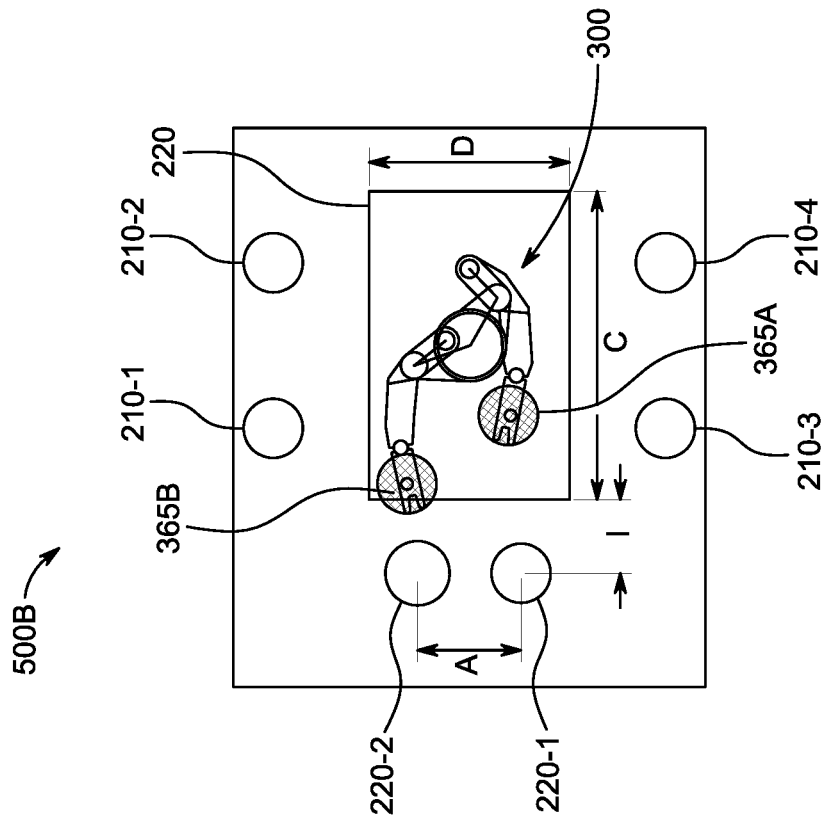
FIGS. 5A-5D illustrate top-down views of the operation of a robot apparatus housed within a rectangular mainframe according to some embodiments.
Figure 5A:
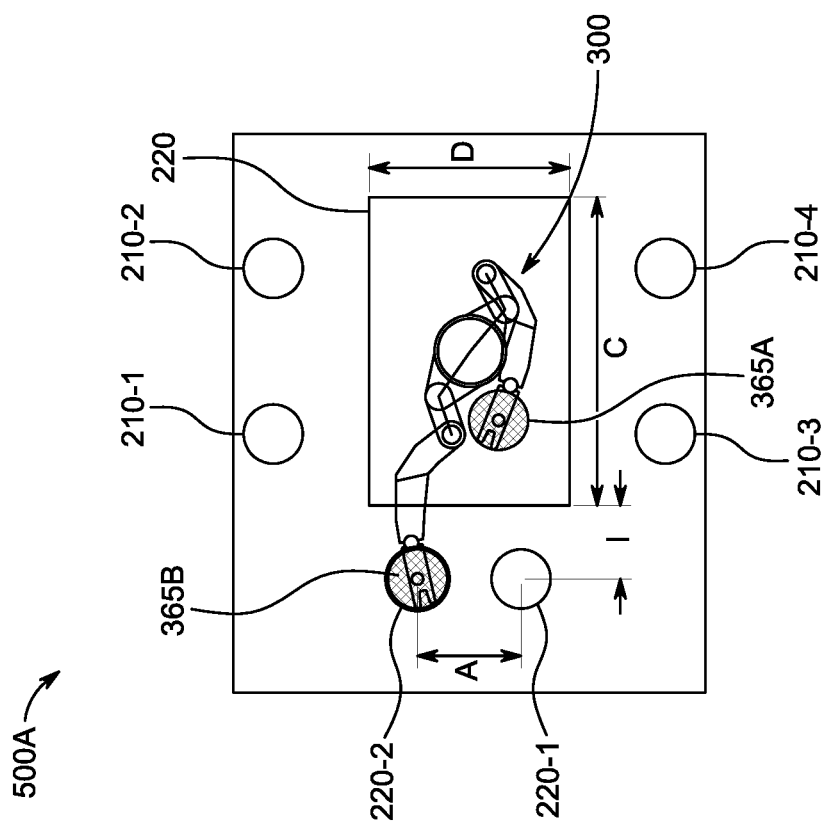

FIG. 5A illustrates independent load lock chamber access with respect to load lock chambers 220-1 and 220-2 separated by the first pitch A, as described above with reference to FIG. 2. More specifically, each of the end effectors 340A and 340B of the robot apparatus 300 (as described above with reference to FIG. 3) retrieves one of the substrates 365A and 365B independently. In this illustrative example, the robot apparatus 300 first extends the end effector 340A into the load lock chamber 220-1 to retrieve the substrate 365A, and then retracts the end effector 340A within the rectangular mainframe 230. After retracting the end effector 340A within the rectangular mainframe 230, the robot apparatus 300 then extends the end effector 340B into the load lock chamber 220-2 to retrieve the substrate 365B, and then retracts the end effector 340B within the rectangular mainframe 230.

FIG. 5B illustrates a top-down view of a substrate processing system ("system") 500B according to some embodiments. More specifically, the system 500B illustrates coordinated load lock chamber access with respect to load lock chambers 220-1 and 220-2 separated by the first pitch A, as described above with reference to FIG. 2. More specifically, instead of independently accessing the load lock chambers with its end effectors 340A and 340B, the robot apparatus 300 coordinates the extension of its end effectors 340A and 340B in a manner that enables the robot apparatus 300 to clear the width D of the rectangular mainframe 230 and avoid collision between end effectors and/or held substrates during extension and/or retraction, in which one of the end effectors lags behind the other end effector during the extension and/or retraction process. In this illustrative example, the robot apparatus 300 initiates retrieval of the substrate 365A by extending the end effector 340A into the load lock chamber 220-1. After a certain amount of time has passed ("lag time"), the robot apparatus 300 then initiates retrieval of the substrate 365B by extending the end effector 340B into the load lock chamber 220-2. The lag time can be chosen to be the smallest amount of time that can maximize throughput while avoiding a collision between the robot apparatus 300 and the rectangular mainframe 230 and/or other end effector. Additionally, there can be multiple speed settings with respect to the speed at which extension and retraction is performed. As an illustrative example, a "slow speed" setting can perform extension in about 2 seconds, and a "fast speed" setting can perform extension in about 1 second. In these examples, the lag time for the slow speed setting can be chosen to be about 1 second and the lag time for the fast speed setting can be chosen to be about 0.5 second.

Figure 5D:
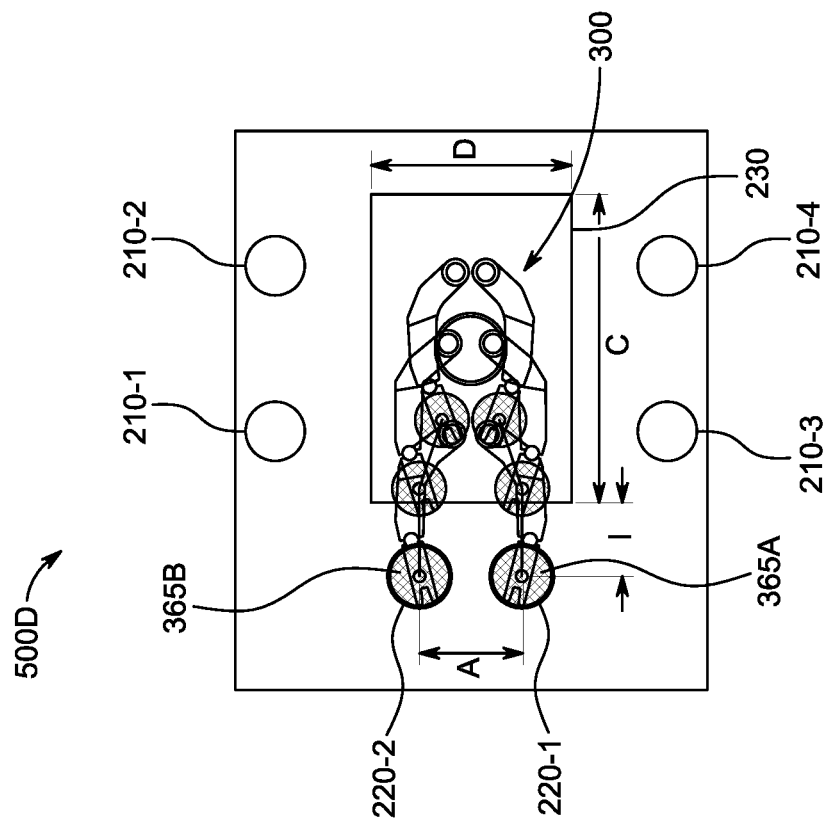
Figure 5C:
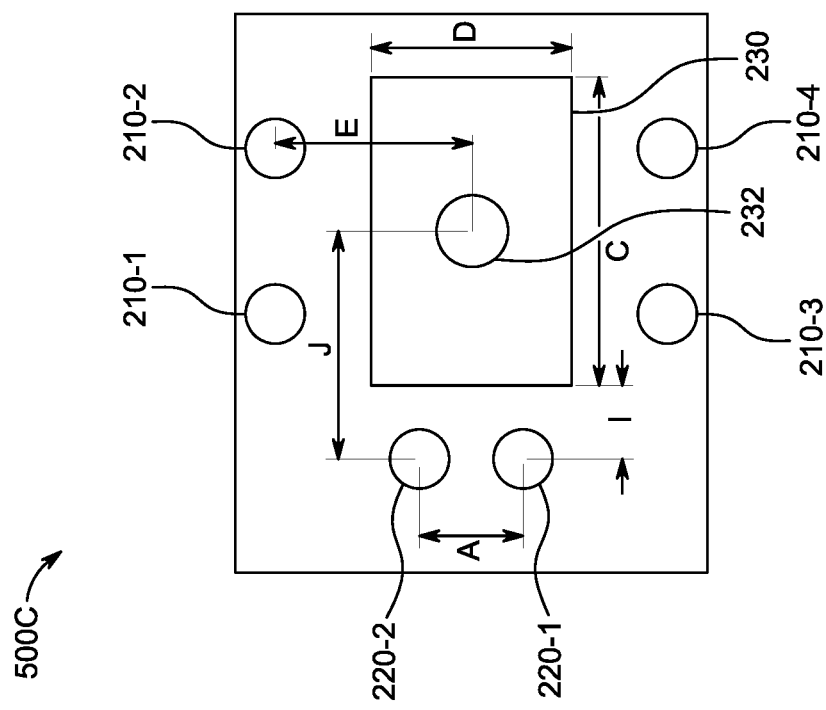

FIG. 5C illustrates a top-down view of a substrate processing system ("system") 500C according to some embodiments. More specifically, the system 500C is based on the system 200 of FIG. 2. In particular, the system 500C shows that the load lock chamber 220-2 and the robot apparatus 232 can be separated by a distance "J" as measured between the centers of the load lock chamber 220-2 and the robot apparatus 230. The distance J is chosen to compensate for the narrower pitch A between the load lock chambers 220-1 and 220-2 as a result of the rectangular shape of mainframe 230. In some embodiments, the distance J is in a range of about 35 inches to about 65 inches. In some embodiments, the distance J is in a range of about 40 inches to about 60 inches. In some embodiments, the distance J is about 50 inches.

FIG. 5D illustrates a top-down view of a substrate processing system ("system") 500D according to some embodiments. More specifically, the system 500D illustrates an example of the robot apparatus 300 being configured to enable individual control of rotation, extraction and retraction and/or variable pitch access with respect to the compressed motion envelope defined by width D of the rectangular mainframe 230. For example, the robot apparatus 300 can extract and retract the substrates 365A and 365B from the respective load lock chambers 220-1 and 220-2. In some embodiments, as will be described in further detail below with reference to FIG. 6, the robot apparatus 300 can be operated with a 4-theta motion driving assembly (2-theta for each of the end effectors). In some embodiments, as will be described in further detail with reference to FIG. 7, the robot apparatus 300 can be operated with a 2-theta motion driving assembly for base links, and motors at the elbow and wrist (e.g., a 6 motor solution).

Figure 6:
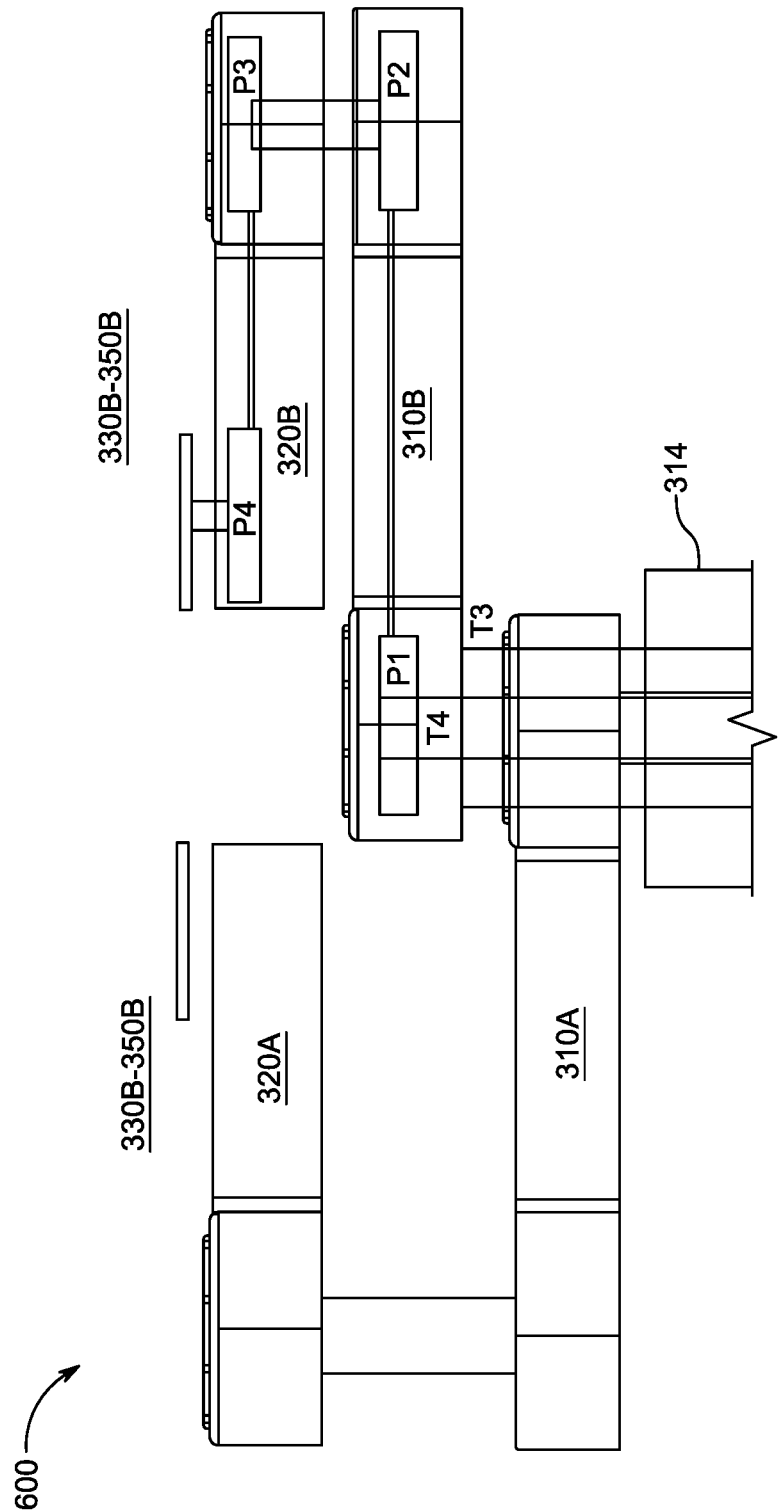
FIGS. 6 and 7 illustrate example robot apparatuses having motion driving assemblies according to some embodiments.

FIG. 6 illustrates an example robot apparatus 600 having a motion driving assembly according to some embodiments. More specifically, the motion driving assembly is a 4-theta motion driving assembly, with 2-theta for each of the end effectors. For example, with respect to the "upper shoulder side" of the robot apparatus 600, the robot apparatus 600 can include elbow motors "T3" and "T5" at respective elbow joints connecting respective links, and wrist motors "T4" and "T6" connecting respective links. T3 rotates upper shoulder 310B, T4 rotates pulley "P1", pulley "P2" is coupled to pulley P1 and rotates pulley "P3" and arm 320B, pulley "P4" is coupled to pulley P3 and rotates the combination of forearm 330B, end effector 340B and (optional) wrist 350B. A similar motion driving assembly can be used to enable motion with respect to the "lower shoulder side" of the robot apparatus 600.

Figure 7:
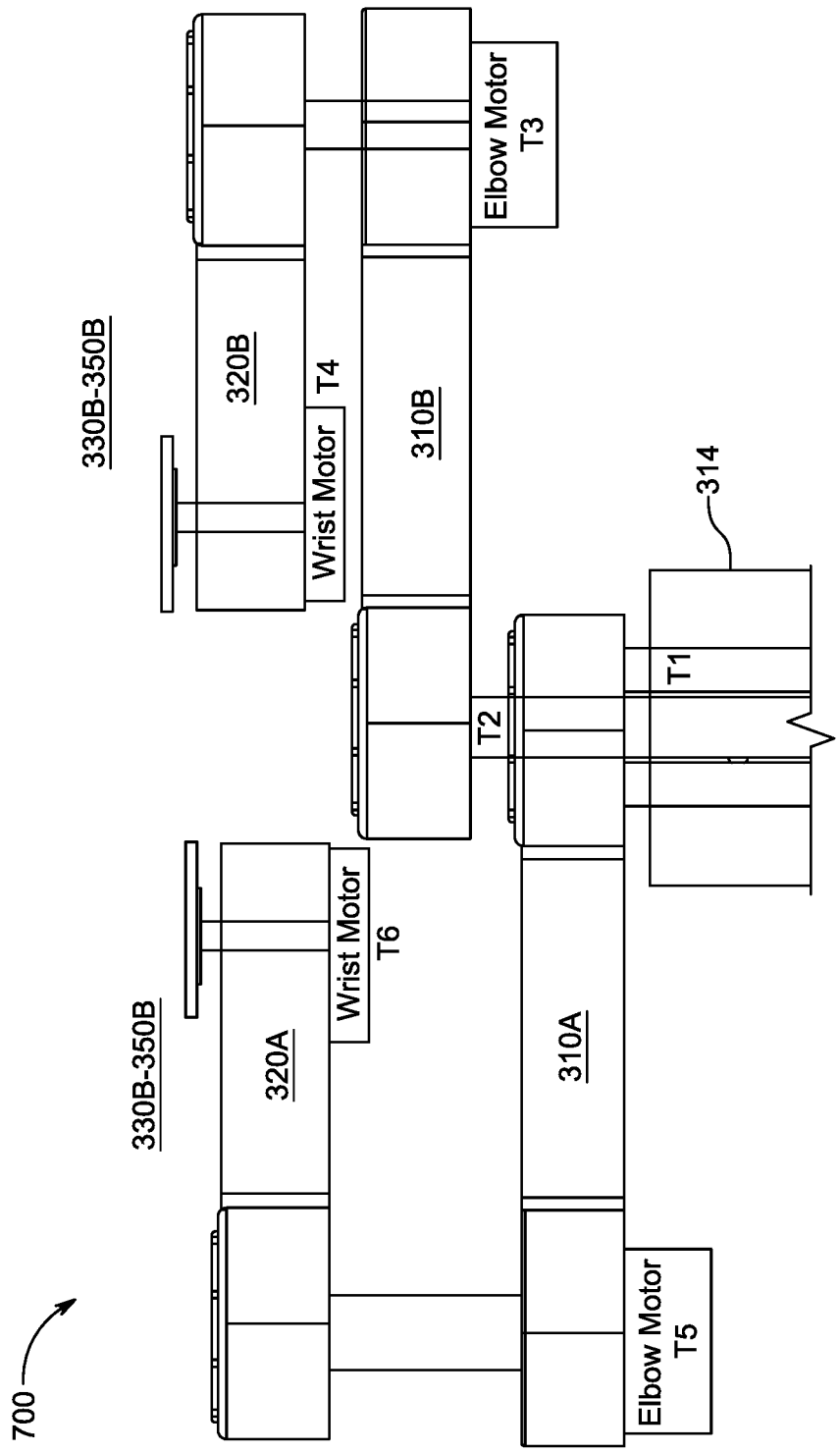

FIG. 7 illustrates an example robot apparatus 700 having a motion driving assembly according to some embodiments. More specifically, FIG. 7 illustrates a 6 motor solution with motors at various joints. For example, the robot apparatus 700 can include a number of motors "T1" through "T6" each at a respective joint. For example, motor T1 be at the joint connecting the body 314 and a first end of the lower shoulder 310A, motor T2 can be at the joint connecting the first end of the lower shoulder 310A and a first end of the upper shoulder 310B, motor T3 can be at the elbow joint connecting a second end of the upper shoulder 310B and a first end of the arm 320B ("elbow motor"), motor T4 can be at the wrist joint connecting a second end of the arm 320B and the combination of forearm 330B, end effector 340B and (optional) wrist 350B ("wrist motor"), motor T5 can be at the elbow joint connecting a second end of the lower shoulder 310B and a first end of the arm 320A ("elbow motor"), and motor T6 can be at the wrist joint connecting a second end of the arm 320A and the combination of forearm 330A, end effector 340A and (optional) wrist 350A ("wrist motor").

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:
1. A robot apparatus, comprising:
   a lower shoulder and an upper shoulder each configured to rotate about a first rotational axis;
   a first arm rotatably coupled to the lower shoulder at a second rotational axis;
   a second arm rotatably coupled to the upper shoulder at a third rotational axis;

a first forearm rotatably coupled to the first arm at a fourth rotational axis and a second forearm rotatably coupled to the second arm at a fifth rotational axis, wherein the first forearm and the second forearm each have a different length from the first arm and the second arm, and wherein the first forearm and the second forearm each have a non-linear shape; and a first end effector coupled to the first forearm and a second end effector coupled to the second forearm;

wherein the robot apparatus is configured to be controlled by a controller to operate within a rectangular mainframe without colliding with walls of the rectangular mainframe by:

extending the first end effector into a first process chamber and extend the second end effector into a second process chamber, wherein the first process chamber and the second process chamber are separated by a first pitch;

retracting the first end effector and the second end effector into the rectangular mainframe while maintaining a distance between the first end effector and the second end effector bounded by the first pitch throughout a retraction process; and folding the first end effector and the second end effector inward within a sweep diameter defined by a width of the rectangular mainframe.

2. The robot apparatus of claim 1, wherein the first pitch is about 36 inches, and wherein the width of the rectangular mainframe is about 43 inches.

3. The robot apparatus of claim 1, wherein the robot apparatus is configured to be controlled by the controller to operate within the rectangular mainframe without colliding with the walls of the rectangular mainframe by simultaneously extending, retracting and folding the first end effector and the second end effector.

4. The robot apparatus of claim 1, wherein the robot apparatus is further configured to be controlled by the controller to operate within the rectangular mainframe without colliding with the walls of the rectangular mainframe by:

extending the first end effector into a first load lock chamber and extend the second end effector into a second load lock chamber, wherein the first load lock chamber and the second load lock chamber are separated by a second pitch less than the first pitch; and retracting the first end effector and the second end effector from the first and second load lock chambers and into the rectangular mainframe.

5. The robot apparatus of claim 4, wherein the robot is further configured to be controlled by the controller to operate within the rectangular mainframe without colliding with the walls of the rectangular mainframe by independently extending the first end effector and the second end effector into, and independently retracting the first end effector and the second end effector from, the first load lock chamber and the second load lock chamber, respectively.

6. The robot apparatus of claim 4, wherein the robot is further configured to be controlled by the controller to operate within the rectangular mainframe without colliding with the walls of the rectangular mainframe by extending the first end effector into the first load lock chamber at a first time and extending the second end effector into the second load lock chamber at a second time after the first time to perform coordination extension and retraction.

7. The robot apparatus of claim 1, further comprising a motion driving assembly.

8. An electronic device processing system, comprising:

a rectangular mainframe;

a first load lock chamber and a second load lock chamber attached to a first side of the rectangular mainframe, wherein a first port of the first load lock and a second port of the second load lock are spaced apart horizontally by a first pitch;

a first process chamber and a second process chamber attached to a second side of the rectangular mainframe, wherein a third port of the first process chamber and a fourth port of the second process chamber are spaced apart horizontally by a second pitch that is greater than the first pitch;

a robot apparatus housed within the rectangular mainframe, the robot apparatus comprising:

a lower shoulder and an upper shoulder each configured to rotate about a first rotational axis;

a first arm rotatably coupled to the lower shoulder at a second rotational axis;

a second arm rotatably coupled to the upper shoulder at a third rotational axis;

a first forearm rotatably coupled to the first arm at a fourth rotational axis and a second forearm rotatably coupled to the second arm at a fifth rotational axis, wherein the first forearm and the second forearm each have a different length from the first arm and the second arm, and wherein the first forearm and the second forearm each have a non-linear shape; and a first end effector coupled to the first forearm and a second end effector coupled to the second forearm; and a controller communicatively coupled to the robot apparatus and configured to cause the robot apparatus to operate in the rectangular mainframe without colliding with walls of the rectangular mainframe by:

extending the first end effector into the first process chamber and extend the second end effector into the second process chamber;

retracting the first end effector and the second end effector into the rectangular mainframe while maintaining a distance between the first end effector and the second end effector bounded by the second pitch throughout retraction; and folding the first end effector and the second end effector inward within a sweep diameter defined by a width of the rectangular mainframe.

9. The electronic device processing system of claim 8, wherein the first pitch is about 22 inches, wherein the second pitch is about 36 inches, and wherein the width of the rectangular mainframe is about 43 inches.

10. The electronic device processing system of claim 8, wherein the controller is to cause the robot apparatus to operate in the rectangular mainframe without colliding with the walls of the rectangular mainframe by causing the robot apparatus to simultaneously extend, retract and fold the first end effector and the second end effector.

11. The electronic device processing system of claim 8, wherein the controller is further configured to cause the robot apparatus to operate in the rectangular mainframe without colliding with the walls of the rectangular mainframe by causing the robot apparatus to:

extend the first end effector into the first load lock chamber and extend the second end effector into the second load lock chamber; and retract the first end effector and the second end effector from the first and second load lock chambers and into the rectangular mainframe.

12. The electronic device processing system of claim 11, wherein the controller is further configured to cause the robot apparatus to operate in the rectangular mainframe without colliding with the walls of the rectangular mainframe by causing the robot apparatus to independent extend the first end effector and the second end effector into, and independently retract the first end effector and the second end effector from, the first load lock chamber and the second load lock chamber, respectively.

13. The electronic device processing system of claim 11, wherein the controller is further configured to cause the robot apparatus to operate in the rectangular mainframe without colliding with the walls of the rectangular mainframe by causing the robot apparatus to extend the first end effector into the first load lock chamber at a first time and to extend the second end effector into the second load lock chamber at a second time after the first time to perform coordination extension and retraction.

14. The electronic device processing system of claim 8, wherein the robot apparatus further comprises a motion driving assembly.

15. A method comprising:
for a robot apparatus comprising:
  a lower shoulder and an upper shoulder each configured to rotate about a first rotational axis;
  a first arm rotatably coupled to the lower shoulder at a second rotational axis;
  a second arm rotatably coupled to the upper shoulder at a third rotational axis;
  a first forearm rotatably coupled to the first arm at a fourth rotational axis and a second forearm rotatably coupled to the second arm at a fifth rotational axis, wherein the first forearm and the second forearm each have a different length from the first arm and the second arm, and wherein the first forearm and the second forearm each have a non-linear shape; and
  a first end effector coupled to the first forearm and a second end effector coupled to the second forearm:
causing, by a controller communicatively coupled to the robot apparatus, the first end effector to be extended into a first process chamber to retrieve a first substrate without colliding with walls of the rectangular mainframe;
causing, by the controller, the second end effector to be extended into a second process chamber to retrieve a second substrate without colliding with the walls of the rectangular mainframe, wherein the first process chamber and the second process chamber are separated by a first pitch;
causing, by the controller, the first end effector and the second end effector to be retracted into a rectangular mainframe while maintaining a distance between the substrates bounded by the first pitch throughout retraction without colliding with the walls of the rectangular mainframe; and
causing, by the controller, the first end effector and the second end effector to be folded inward within a sweep diameter defined by a width of the rectangular mainframe without colliding with the walls of the rectangular mainframe.

16. The method of claim 15, wherein the robot apparatus is configured to simultaneously extend, retract and fold the first end effector and the second end effector.

17. The method of claim 15, further comprising:
causing, by the controller, the first end effector to be extended into a first load lock chamber to retrieve a first substrate and the second end effector to be extended into a second load lock chamber to retrieve a second substrate without colliding with the walls of the rectangular mainframe, wherein the first load lock chamber and the second load lock chamber are separated by a second pitch that is less than the first pitch; and
after the robot apparatus retrieves the first and second substrates from the first and second load locks, causing, by the controller, the first end effector and the second end effector to be retracted from the first load lock chamber and the second load lock chamber and into the rectangular mainframe without colliding with the walls of the rectangular mainframe.

18. The method of claim 17, wherein the first end effector and the second end effector are independently extended into, and independently retracted from, the first load lock chamber and the second load lock chamber, respectively.

19. The method of claim 17, wherein the first end effector is extended into the first load lock chamber at a first time and the second end effector is extended into the second load lock chamber at a second time after the first time to perform coordination extension and retraction.

20. The method of claim 15, wherein the robot apparatus further comprises a motion driving assembly.

* * * * *